United States Patent
Hsu et al.

(10) Patent No.: US 11,011,533 B2
(45) Date of Patent: May 18, 2021

(54) MEMORY STRUCTURE AND PROGRAMING AND READING METHODS THEREOF

(71) Applicant: eMemory Technology Inc., Hsinchu (TW)

(72) Inventors: Chia-Jung Hsu, Hsinchu County (TW); Wein-Town Sun, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 16/219,963

(22) Filed: Dec. 14, 2018

(65) Prior Publication Data

US 2019/0214400 A1    Jul. 11, 2019

Related U.S. Application Data

(60) Provisional application No. 62/615,463, filed on Jan. 10, 2018.

(30) Foreign Application Priority Data

Nov. 23, 2018    (TW) .................................. 107141961

(51) Int. Cl.
*H01L 27/11558* (2017.01)
*H01L 27/11519* (2017.01)
(Continued)

(52) U.S. Cl.
CPC ........ *H01L 27/11558* (2013.01); *G11C 16/10* (2013.01); *G11C 16/26* (2013.01); *H01L 27/11519* (2013.01); *H01L 27/11524* (2013.01)

(58) Field of Classification Search
CPC ......... H01L 27/11558; H01L 27/11517; H01L 27/11519; H01L 27/11524; G11C 16/0433; G11C 16/0441
See application file for complete search history.

(56) References Cited

U.S. PATENT DOCUMENTS

| 7,209,392 B2 | 4/2007 | Chen et al. |
| 2006/0018161 A1* | 1/2006 | Chen ............... H01L 27/115 |
| | | 365/185.28 |

(Continued)

FOREIGN PATENT DOCUMENTS

| CN | 103311188 | 9/2013 |
| CN | 104241293 | 12/2014 |

(Continued)

OTHER PUBLICATIONS

"Office Action of Taiwan Counterpart Application," dated Oct. 1, 2019, p. 1-p. 10.

(Continued)

*Primary Examiner* — Changhyun Yi
(74) *Attorney, Agent, or Firm* — JCIPRNET

(57) ABSTRACT

A memory structure including a first select transistor, a first floating gate transistor, a second select transistor, a second floating gate transistor, and a seventh doped region is provided. The first select transistor includes a select gate, a first doped region, and a second doped region. The first floating gate transistor includes a floating gate, the second doped region, and a third doped region. The second select transistor includes the select gate, a fourth doped region, and a fifth doped region. The second floating gate transistor includes the floating gate, the fifth doped region, and a sixth doped region. A gate width of the floating gate in the second floating gate transistor is greater than a gate width of the floating gate in the first floating gate transistor. The floating gate covers at least a portion of the seventh doped region.

28 Claims, 5 Drawing Sheets

(51) Int. Cl.
  *G11C 16/10* (2006.01)
  *G11C 16/26* (2006.01)
  *H01L 27/11524* (2017.01)

(56) References Cited

U.S. PATENT DOCUMENTS

| | | |
|---|---|---|
| 2010/0157669 A1 | 6/2010 | Audzeyeu et al. |
| 2010/0329016 A1 | 12/2010 | Taniguchi |
| 2012/0087192 A1 | 4/2012 | Fang et al. |
| 2012/0236646 A1* | 9/2012 | Hsu ............... H01L 29/66825 365/185.14 |
| 2014/0108705 A1* | 4/2014 | Gorobets .......... G11C 16/3431 711/103 |
| 2015/0348635 A1 | 12/2015 | La Rosa et al. |
| 2016/0232977 A1 | 8/2016 | Yamakoshi |
| 2016/0379687 A1 | 12/2016 | Chen et al. |

FOREIGN PATENT DOCUMENTS

| | | |
|---|---|---|
| CN | 104517966 | 4/2015 |
| CN | 204966056 | 1/2016 |
| CN | 106206591 | 12/2016 |
| JP | 2011009454 | 1/2011 |
| JP | 2013102119 | 5/2013 |
| JP | 2015070264 | 4/2015 |
| JP | 2016143856 | 8/2016 |

OTHER PUBLICATIONS

"Office Action of China Counterpart Application", dated Aug. 3, 2020, p. 1-p. 12.
"Office Action of Japan Counterpart Application", dated Jan. 28, 2020, pp. 1-9.

* cited by examiner

MEMORY STRUCTURE AND PROGRAMING AND READING METHODS THEREOF

CROSS-REFERENCE TO RELATED APPLICATION

This application claims the priority benefits of U.S. provisional application Ser. No. 62/615,463, filed on Jan. 10, 2018 and Taiwan application serial no. 107141961, filed on Nov. 23, 2018. The entirety of each of the above-mentioned patent applications is hereby incorporated by reference herein and made a part of this specification.

BACKGROUND OF THE INVENTION

Field of the Invention

The invention relates to a semiconductor structure and an operation method thereof, and particularly relates to a memory structure and programming and reading methods thereof.

Description of Related Art

A non-volatile memory has the advantage of retaining data after being powered off. Therefore, many electronic products require the non-volatile memory to maintain normal operation when the electronic products are turned on. However, how to further improve the electrical performance of the memory device is a goal of continuous efforts in the industry.

SUMMARY OF THE INVENTION

The invention provides a memory structure, which can effectively improve the electrical performance of the memory device.

The invention provides a programming method of a memory structure, which can effectively improve program performance.

The invention provides a reading method of a memory structure, which can effectively improve the reading performance.

The invention provides a memory structure, which includes a first select transistor, a first floating gate transistor, a second select transistor, a second floating gate transistor, and a seventh doped region. The first select transistor includes a select gate, a first doped region, and a second doped region, wherein the first doped region and the second doped region are located on two sides of the select gate. The first floating gate transistor includes a floating gate, the second doped region, and a third doped region, wherein the second doped region and the third doped region are located on two sides of the floating gate. The second select transistor includes the select gate, a fourth doped region, and a fifth doped region, wherein the fourth doped region and the fifth doped region are located on two sides of the select gate. The second floating gate transistor includes the floating gate, the fifth doped region, and a sixth doped region, wherein the fifth doped region and the sixth doped region are located on two sides of the floating gate. The gate width of the floating gate in the second floating gate transistor is greater than the gate width of the floating gate in the first floating gate transistor. The floating gate covers at least a portion of the seventh doped region.

According to an embodiment of the invention, in the memory structure, the gate length of the floating gate in the second floating gate transistor may be greater than the gate length of the floating gate in the first floating gate transistor.

According to an embodiment of the invention, in the memory structure, the gate width of the select gate in the second select transistor may be greater than the gate width of the select gate in the first select transistor.

According to an embodiment of the invention, in the memory structure, the gate width of the select gate in the first select transistor may be greater than the gate width of the floating gate in the first floating gate transistor.

According to an embodiment of the invention, in the memory structure, the select gate and the floating gate may be disposed apart from each other and may extend in a first direction.

According to an embodiment of the invention, in the memory structure, the select gate may extend through the first select transistor and the second select transistor.

According to an embodiment of the invention, in the memory structure, the floating gate may extend through the first floating gate transistor and the second floating gate transistor.

According to an embodiment of the invention, in the memory structure, the first select transistor and the first floating gate transistor may be arranged in a second direction, and the second direction intersects the first direction.

According to an embodiment of the invention, in the memory structure, the second select transistor and the second floating gate transistor may be arranged in a second direction, and the second direction intersects the first direction.

According to an embodiment of the invention, in the memory structure, the first select transistor, the second select transistor, the first floating gate transistor, and the second floating gate transistor are, for example, P-type metal oxide semiconductor (PMOS) transistors. The first doped region to the sixth doped region are, for example, P-type doped regions.

According to an embodiment of the invention, the memory structure may further include an N-type well. The first doped region to the sixth doped region may be located in the N-type well.

According to an embodiment of the invention, the memory structure may further include a P-type well. The P-type well is located between the N-type well and the seventh doped region.

According to an embodiment of the invention, in the memory structure, the seventh doped region is, for example, an N-type doped region. The seventh doped region may be located in a P-type substrate or a P-type well.

According to an embodiment of the invention, in the memory structure, the first select transistor, the second select transistor, the first floating gate transistor, and the second floating gate transistor are, for example, N-type metal oxide semiconductor (NMOS) transistors. The first doped region to the sixth doped region are, for example, N-type doped regions.

According to an embodiment of the invention, the memory structure may further include a P-type well. The first doped region to the sixth doped region may be located in the P-type well.

According to an embodiment of the invention, in the memory structure, the seventh doped region is, for example, an N-type doped region. The seventh doped region may be located in a P-type substrate or a P-type well.

The invention provides a programming method of the memory structure, which include the following steps. When a program operation is performed on a path formed by the first select transistor and the first floating gate transistor, a ramp voltage is applied to the fourth doped region and the sixth doped region.

According to an embodiment of the invention, the programming method of the memory structure may further include applying the ramp voltage to the seventh doped region.

According to an embodiment of the invention, in the programming method of the memory structure, the ramp voltage is, for example, less than or equal to a program voltage.

According to an embodiment of the invention, in the programming method of the memory structure, a voltage application mode of the ramp voltage is, for example, a single-stage incremental application mode, a multi-stage incremental application mode, or a smooth incremental application mode.

The invention provides another programming method of the memory structure, which includes the following steps. When a program operation is performed on a path formed by the first select transistor and the first floating gate transistor, a program voltage is applied to the fourth doped region and the sixth doped region.

According to an embodiment of the invention, the programming method of the memory structure may further include applying the program voltage to the seventh doped region.

The invention provides a reading method of the memory structure, which includes the following steps. When a read operation is performed on a path formed by the second select transistor and the second floating gate transistor, an auxiliary voltage is applied to the first doped region and the third doped region.

According to an embodiment of the invention, the reading method of the memory structure may further include applying the auxiliary voltage to the seventh doped region.

According to an embodiment of the invention, in the reading method of the memory structure, the auxiliary voltage is, for example, less than or equal to a read voltage (VRGSL).

The invention provides another reading method of the memory structure, which include the following steps. When a read operation is performed on a path formed by the second select transistor and the second floating gate transistor, the read operation is simultaneously performed on a path formed by the first select transistor and the first floating gate transistor.

According to an embodiment of the invention, the reading method of the memory structure may further include applying an auxiliary voltage to the seventh doped region.

According to an embodiment of the invention, in the reading method of the memory structure, the auxiliary voltage is, for example, less than or equal to a read voltage.

Based on the above description, in the memory structure according to the invention, the gate width of the floating gate in the second floating gate transistor is greater than the gate width of the floating gate in the first floating gate transistor. Therefore, when the program operation is performed on the path formed by the first select transistor and the first floating gate transistor, the current required for the program operation can be reduced, thereby saving power and improving the product reliability and the product yield.

Furthermore, in the programming method of the memory structure according to the invention, in the case where the first select transistor, the second select transistor, the first floating gate transistor, and the second floating gate transistor are PMOS transistors, when the program operation is performed on the path formed by the first select transistor and the first floating gate transistor, the program efficiency can be effectively improved by applying the ramp voltage to the fourth doped region and the sixth doped region. In the case where the first select transistor, the second select transistor, the first floating gate transistor, and the second floating gate transistor are NMOS transistors, when the program operation is performed on the path formed by the first select transistor and the first floating gate transistor, the program efficiency can be effectively improved by applying the program voltage to the fourth doped region and the sixth doped region.

Moreover, in the reading method of the memory structure according to the invention, when the read operation is performed on the path formed by the second select transistor and the second floating gate transistor, the reading error caused by an increase in the off-current (Ioff) can be prevented by applying the auxiliary voltage to the first doping region and the third doping region, whereby the correctness of the read operation can be improved. In addition, in another reading method of the memory structure according to the invention, when the read operation is performed on the path formed by the second select transistor and the second floating gate transistor, the on-current (Ion) can be increased by simultaneously performing the read operation on the path formed by the first select transistor and the first floating gate transistor, whereby the read efficiency can be improved.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
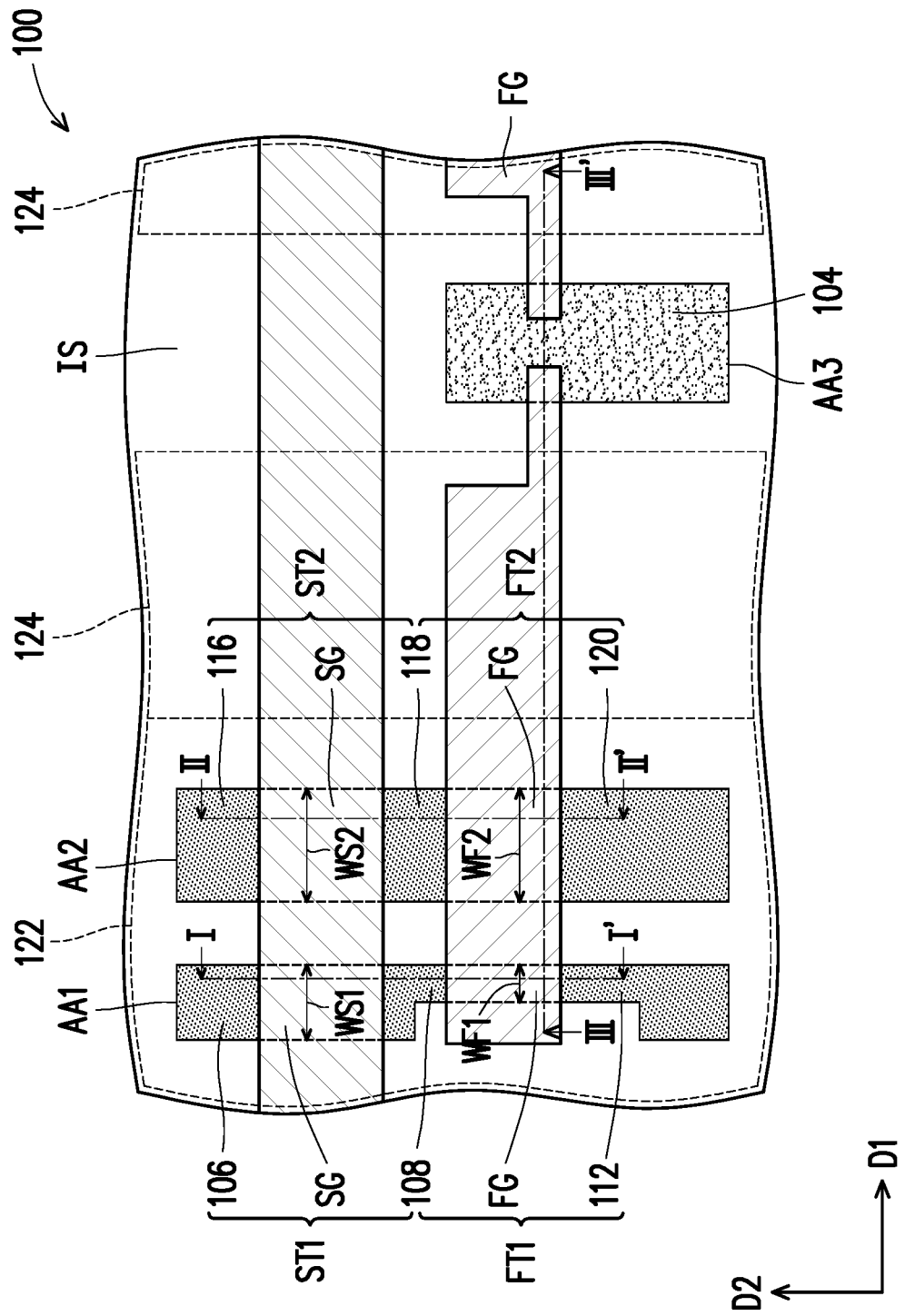
FIG. 1A is a top view of a memory structure according to an embodiment of the invention.
Figure 1C:
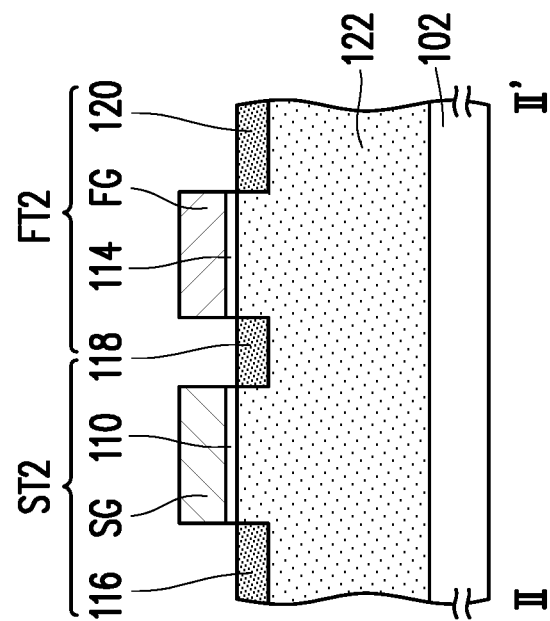
FIG. 1C is a cross-sectional view taken along section line II-II' in FIG. 1A.
Figure 1B:
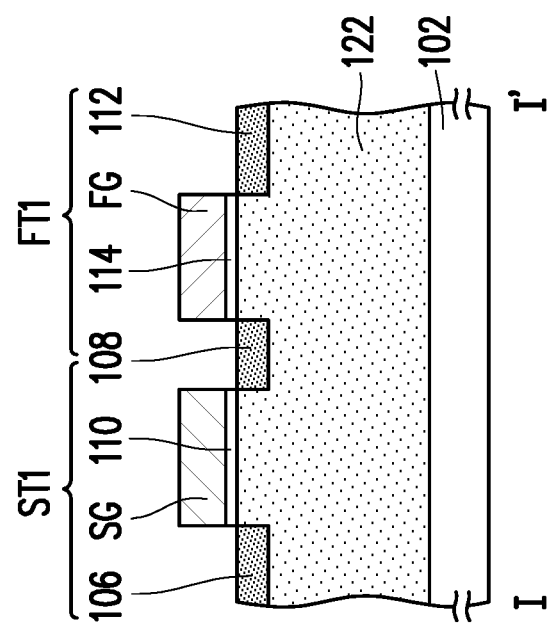
FIG. 1B is a cross-sectional view taken along section line I-I' in FIG. 1A.
Figure 1D:
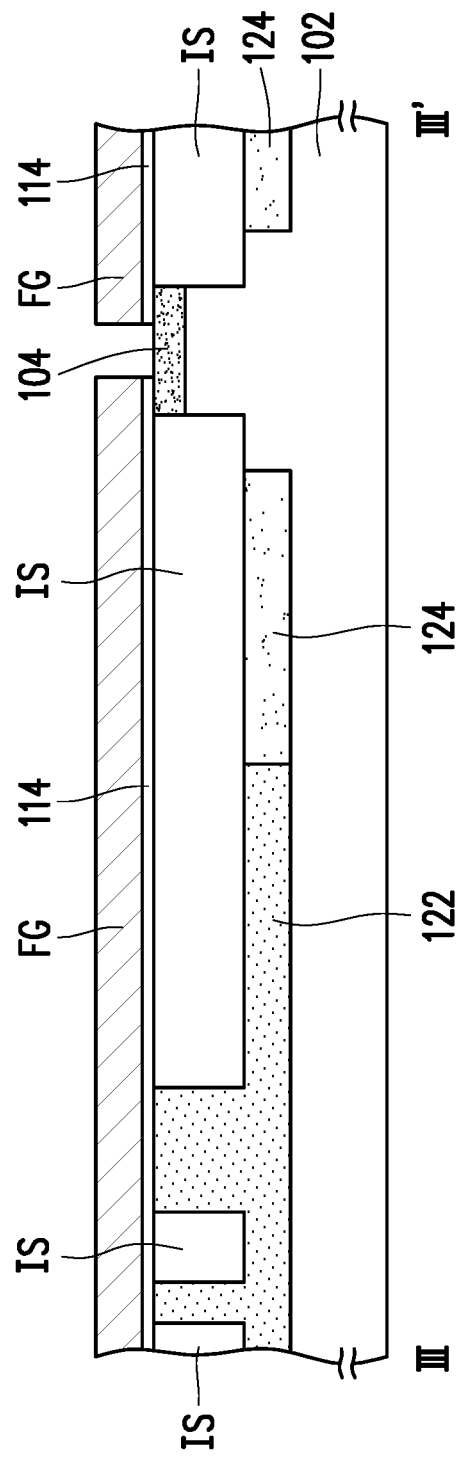
FIG. 1D is a cross-sectional view taken along section line III-III' in FIG. 1A.

FIG. 1A is a top view of a memory structure according to an embodiment of the invention. FIG. 1B is a cross-sectional view taken along section line I-I' in FIG. 1A. FIG. 1C is a cross-sectional view taken along section line II-II' in FIG. 1A. FIG. 1D is a cross-sectional view taken along section line III-III' in FIG. 1A.

Referring to FIG. 1A to FIG. 1D, the memory structure 100 includes a substrate 102, a select transistor ST1, a floating gate transistor FT1, a select transistor ST2, a floating gate transistor FT2, and a doped region 104. The select transistor ST1 and the select transistor ST2 may be arranged in a first direction D1, the floating gate transistor FT1 and the floating gate transistor FT2 may be arranged in the first direction D1, the select transistor ST1 and the floating gate transistor FT1 may be arranged in a second direction D2, and the select transistor ST2 and the floating gate transistor FT2 may be arranged in the second direction D2. The second direction D2 intersects the first direction D1. In the present embodiment, the second direction D2 is, for example, perpendicular to the first direction D1, but the invention is not limited thereto. In addition, the first direction D1 may be parallel to the channel width direction of the select transistor ST1, the floating gate transistor FT1, the select transistor ST2, and the floating gate transistor FT2. The second direction D2 may be parallel to the channel length direction of the select transistor ST1, the floating gate transistor FT1, the select transistor ST2, and the floating gate transistor FT2.

Substrate 102 may be a semiconductor substrate, such as silicon substrate. In the present embodiment, the substrate 102 is exemplified by a P-type substrate, but the invention is not limited thereto. Furthermore, an isolation structure IS may be disposed in the substrate 102, and an active region AA1, an active region AA2, and an active region AA3 may be defined in the substrate 102 by the isolation structure IS. The isolation structure IS is, for example, a shallow trench isolation (ST1) structure. The active region AA1 and the active region AA2 may respectively extend in the second direction D2. In addition, the doped region 106, the doped region 108, and the doped region 112 may be located in the active region AA. The doped region 116, the doped region 118 and the doped region 120 may be located in the active region AA2. The doped region 104 may be located in the active region AA3.

The select transistor ST1 includes a select gate SG, a doped region 106, and a doped region 108, wherein the doped region 106 and the doped region 108 are located on two sides of the select gate SG. The select transistor ST1 may further include a dielectric layer 110. The select gate SG may be located on the substrate 102. The select gate SG may extend in the first direction D1. The material of the select gate SG is, for example, doped polysilicon. The doped region 106 and the doped region 108 may be located in the substrate 102 on two sides of the select gate SG. The doped region 106 and the doped region 108 may be used as a source or a drain, respectively. The dielectric layer 110 may be located between the select gate SG and the substrate 102. The material of the dielectric layer 110 is, for example, silicon oxide.

The floating gate transistor FT1 includes a floating gate FG, the doped region 108, and a doped region 112, wherein the doped region 108 and the doped region 112 are located on two sides of the floating gate FG. The floating gate transistor FT1 may further include a dielectric layer 114. The floating gate FG may be located on the substrate 102. The select gate SG and the floating gate FG may be disposed apart from each other. The floating gate FG may extend in the first direction D1. The material of the floating gate FG is, for example, doped polysilicon. The doped region 108 and the doped region 112 may be located in the substrate 102 on two sides of the floating gate FG. The doped region 108 and the doped region 112 may be used as a source or a drain, respectively. The floating gate transistor FT1 and the select transistor ST1 may share the doped region 108. The dielectric layer 114 may be located between the floating gate FG and the substrate 102. The material of the dielectric layer 114 is, for example, silicon oxide.

The select transistor ST2 includes the select gate SG, a doped region 116, and a doped region 118, wherein the doped region 116 and the doped region 118 are located on two sides of the select gate SG. The select transistor ST2 may further include the dielectric layer 110. The select gate SG may extend through the select transistor ST1 and select transistor ST2, so that the select transistor ST1 and the select transistor ST2 may share the select gate SG. The doped region 116 and the doped region 118 may be located in the substrate 102 on two sides of the select gate SG. The doped region 116 and the doped region 118 may be used as a source or a drain, respectively. The dielectric layer 110 may be located between the select gate SG and the substrate 102.

The floating gate transistor FT2 includes the floating gate FQG the doped region 118, and a doped region 120, wherein the doped region 118 and the doped region 120 are located on two sides of the floating gate FG. The floating gate transistor FT2 may further include the dielectric layer 114. The floating gate FG may extend through the floating gate transistor FT1 and the floating gate transistor FT2, so that the floating gate transistor FT1 and the floating gate transistor FT2 may share the floating gate FG. The doped region 118 and the doped region 120 may be located in the substrate 102 on two sides of the floating gate FG. The doped region 118 and the doped region 120 may be used as a source or a drain, respectively. The floating gate transistor FT2 and the select transistor ST2 may share the doped region 118. The dielectric layer 114 is located between the floating gate FG and the substrate 102.

In the present embodiment, the term "gate width" is defined as the width in the first direction D1 of the portion of the gate (e.g., the select gate SG or the floating gate FG) that overlaps the active region. In addition, the term "gate length" is defined as the length in the second direction D2 of the portion of the gate (e.g., the gate SG or the floating gate FG) that overlaps the active region.

In the present embodiment, the gate width WF2 of the floating gate FG in the floating gate transistor FT2 is greater than the gate width WF1 of the floating gate FG in the floating gate transistor FT1. Therefore, when the program operation is performed on the path formed by the select transistor ST1 and the floating gate transistor FT1, the current required for the program operation can be reduced, thereby saving power and improving the product reliability and the product yield. Furthermore, the gate width WS2 of the select gate SG in the select transistor ST2 may be greater than the gate width WS1 of the select gate SG in the select transistor ST1. Moreover, the gate width WS1 of the select gate SG in the select transistor ST1 may be greater than the gate width WF1 of the floating gate FG in the floating gate transistor FT1.

The doped region 104 may be located in the substrate 102 of the active region AA3. The doped region 104 may be used as an erase gate, and the active region AA3 may be used as an erase gate region. In the present embodiment, the erase gate region includes the doped region 104, but the invention is not limited thereto. In other embodiments, the erase gate region may further include other doped regions depending on product requirements. The floating gate FG covers at least a portion of the doped region 104. The doped region 104 is, for example, an N-type doped region. The doped region 104 may be located in a P-type substrate or a P-type well. In the present embodiment, the doped region 104 is, for example, the N-type doped region located in the P-type substrate, but the invention is not limited thereto. In another embodiment, the doped region 104 may be located in a P-type well.

In this embodiment, the select transistor ST1, the select transistor ST2, the floating gate transistor FT1, and the floating gate transistor FT2 are exemplified by PMOS transistors, and the doped region 106, the doped region 108, the doped region 112, the doped region 116, and the doped region 118, and the doped region 120 are exemplified by P-type doped regions, but the invention is not limited thereto. In addition, the memory structure 100 may further include at least one of an N-type well 122 and a P-type well 124. The N-type well 122 is located in the substrate 102. The doped region 106, the doped region 108, the doped region 112, the doped region 116, the doped region 118, and the doped region 120 may be located in the N-type well 122. The P-type well 124 may be located in a substrate 102 between the N-type well 122 and the doped region 104.

Hereinafter, the operation method of the memory structure 100 will be described.

The programming method of memory structure 100 includes the following steps. When the program operation is performed on the path formed by select transistor ST1 and the floating gate transistor FT1, a ramp voltage is applied to the doped region 116 and the doped region 120. Furthermore, the programming method of the memory structure 100 may further include applying the ramp voltage to the doped region 104. The method of the program operation is, for example, channel hot electron injection (CHEI). The ramp voltage is, for example, less than or equal to the program voltage. The voltage application mode of the ramp voltage is, for example, a single-stage incremental application mode, a multi-stage incremental application mode, or a smooth incremental application mode.

Hereinafter, various voltage application modes of the ramp voltage will be described by increasing the ramp voltage from 0V to the program voltage as an example. The single-stage incremental application mode is to apply the program voltage directly after applying 0V. The multi-stage incremental application mode is to increase the applied voltage to the program voltage in stages after applying 0V. The smoothing incremental application mode is to increase the applied voltage from 0V to the program voltage in a continuously increasing manner.

When the ramp voltage is a low voltage, the ramp voltage helps to turn on the channel of the floating gate transistor FT1, whereby the generation of the stuck bit can be prevented. Furthermore, after the channel of the floating gate transistor FT1 is turned on, the ramp voltage may be increased, whereby the electron-attracting capability of the floating gate can be improved to increase the on-current (Ion). Therefore, the program efficiency can be improved. Moreover, since the memory structure 100 can prevent the generation of the stuck bit by applying the ramp voltage, the soft program step can be omitted, thereby improving the product reliability and the product yield and saving the soft programming time.

The read method of the memory structure 100 may include a single path read operation or a dual path read operation. In an embodiment of the single path read operation, the reading method of the memory structure 100 includes the following steps. When the read operation is performed on the path formed by the select transistor ST2 and the floating gate transistor FT2, an auxiliary voltage may be applied to the doped region 106 and the doped region 112. The reading method of the memory structure 100 may further include applying the auxiliary voltage to the doped region 104. The auxiliary voltage is, for example, less than or equal to the read voltage.

After the memory structure 100 has been operated for a certain number of times, the off-current (Ioff) may be increased. When the memory structure 100 is read, the off-current (Ioff) can be reduced by applying an auxiliary voltage. In this way, the reading error caused by an increase in the off-current (Ioff) can be prevented, whereby the correctness of the read operation can be improved. Furthermore, in the case where the off-current (Ioff) does not cause the reading error, the auxiliary voltage may not be applied and the doped region 104 is applied with 0V instead.

In an embodiment of the dual path read operation, the reading method of the memory structure 100 includes the following steps. When the read operation is performed on the path formed by select transistor ST2 and the floating gate transistor FT2, the read operation is simultaneously performed on the path formed by select transistor ST1 and the floating gate transistor FT1. Therefore, the on-current (Ion) of the read operation can be increased, whereby the read efficiency can be improved. Moreover, the reading method of the memory structure 100 may further include applying the auxiliary voltage to the doped region 104, whereby the reading error caused by an increase in the off-current (Ioff) can be prevented. Therefore, the correctness of the read operation can be improved. In addition, in the case where the off-current (Ioff) does not cause the reading error, the auxiliary voltage may not be applied and the doped region 104 is applied with 0V instead. The auxiliary voltage is, for example, less than or equal to the read voltage.

The erasing method of the memory structure 100 is, for example, Fowler-Nordheim tunneling (FN tunneling). For example, a high voltage may be applied to the doped region 104 to pull out the electrons stored in the floating gate FG.

Furthermore, Table 1 below is taken as an example to describe the voltage application method when the memory structure 100 is operated, but the invention is not limited thereto. In Table 1, the program voltage (VPP) is, for example, 7V. The ramp voltage (Ramp) is, for example, 0V to VPP. The erase voltage (VEE) is, for example, 15V. The read voltage (VRGSL) is, for example, 2.5V. The auxiliary voltage is, for example, 0 to VRGSL.

TABLE 1

| | program operation | erase operation | dual path read operation | single path read operation |
| --- | --- | --- | --- | --- |
| doped region 106 | VPP | 0 | VRGSL | 0 or auxiliary voltage |
| doped region 112 | 0 | 0 | 0 | 0 or auxiliary voltage |
| doped region 116 | Ramp | 0 | VRGSL | VRGSL |
| doped region 120 | Ramp | 0 | 0 | 0 |
| select gate SG | one-half of VPP | 0 | 0 | 0 |
| doped region 104 (erase gate) | Ramp | VEE | 0 or auxiliary voltage | 0 or auxiliary voltage |
| P type well 124 | 0 | 0 | 0 | 0 |
| N type well 122 | VPP | 0 | VRGSL | VRGSL |

Based on the aforementioned embodiment, in the memory structure 100, the gate width WF2 of the floating gate FG in the floating gate transistor FT2 is greater than the gate width WF1 of the floating gate FG in the floating gate transistor FT1. Therefore, when the program operation is performed on the path formed by the select transistor ST1 and the floating gate transistor FT1, the current required for the program operation can be reduced, thereby saving power and improving the product reliability and the product yield. In some embodiments, the programming method of memory structure 100 can improve program performance by applying the ramp voltage. In some embodiments, the reading method of the memory structure 100 can improve the correctness of the read operation by applying the auxiliary voltage. In some embodiments, the reading method of the memory structure 100 can improve read efficiency by the dual path read operation. In some embodiments, the program operation and the read operation of the memory structure 100 can be performed by different paths, whereby the endurance of the product can be improved.

Figure 2:
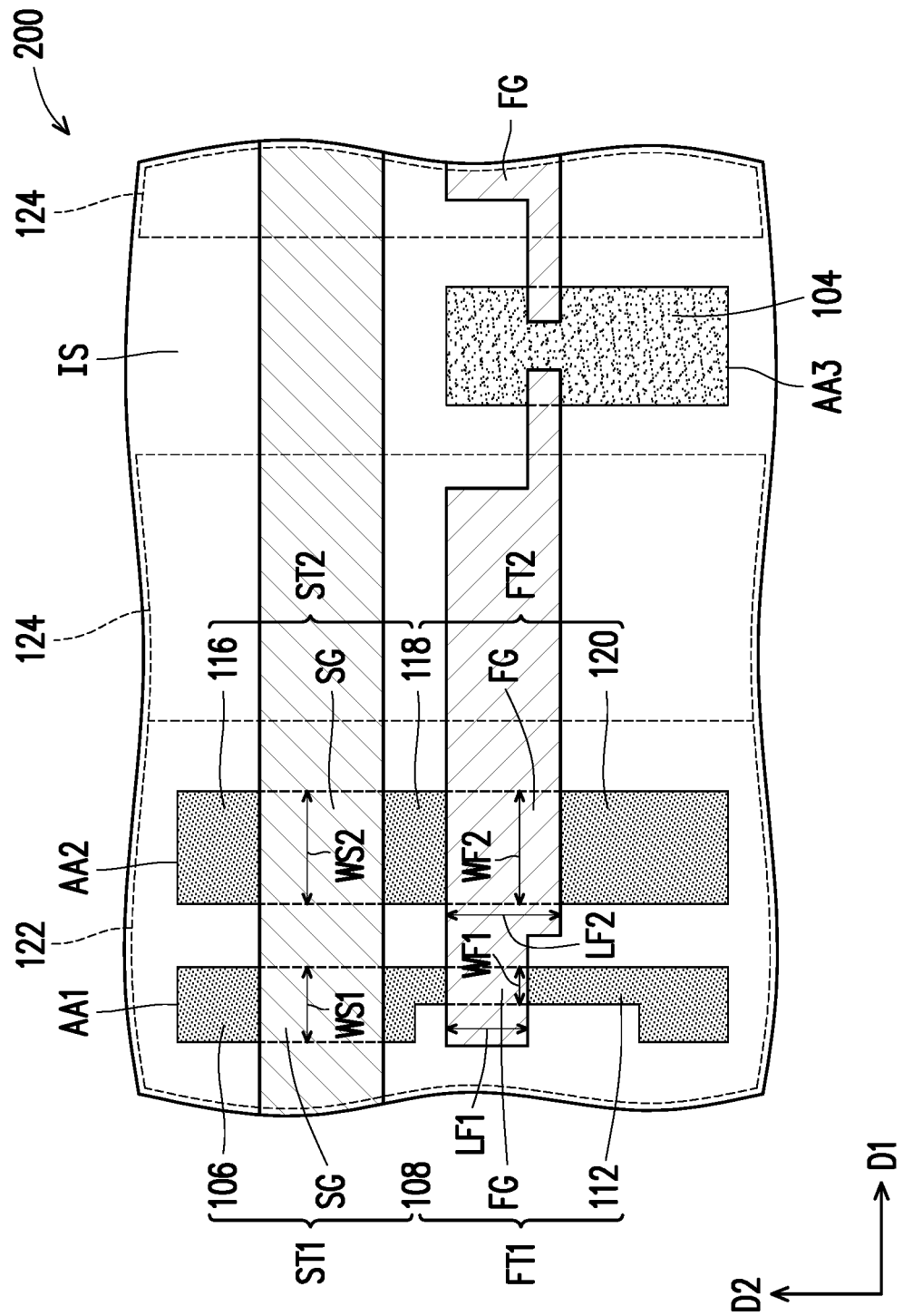
FIG. 2 is a top view of a memory structure according to another embodiment of the invention.

FIG. 2 is a top view of a memory structure according to another embodiment of the invention.

Referring to FIG. 1 and FIG. 2, the difference between the memory structure 100 and the memory structure 200 is described as follows. In the memory structure 100, the gate length of the floating gate FG in the floating gate transistor FT1 and the gate length of the floating gate FG in the floating gate transistor FT2 may be approximately the same. In the memory structure 200, the gate length LF1 of the floating gate FG in the floating gate transistor FT1 is shortened, so that the gate length LF2 of the floating gate FG in the floating gate transistor FT2 may be greater than the gate length LF1 of the floating gate FG in the floating gate transistor FT1. The gate length LF1 of the floating gate FG in the floating gate transistor FT1 is approximately equal to the channel length of the floating gate transistor FT1. In this way, in the case where the gate length LF1 is set to the length that allows the short channel effect to occur in the floating gate transistor FT1, the program voltage required for the program operation can be effectively reduced. Furthermore, the same components in the memory structure 200 and the memory structure 100 are denoted by the same reference numerals and the description thereof is omitted.

The difference between the operation method of the memory structure 200 and the operation method of the memory structure 100 is as follows. In the case where the gate length LF1 is set to the length that allows the short channel effect to occur in the floating gate transistor FT1, the reading method of the memory structure 200 is performed the single path read operation on the path formed by the select transistor ST2 and the floating gate transistor FT2, and the auxiliary voltage may or may not be applied. In addition, for the remaining operation methods of the memory structure 200, reference may be made to the operation method of the memory structure 100, and the description thereof is not repeated here.

Furthermore, Table 2 below is taken as an example to describe the voltage application method when the memory structure 200 is operated, but the invention is not limited thereto. In Table 2, the program voltage (VPP) is, for example, 6.5V. The ramp voltage (Ramp) is, for example, 0V to VPP. The erase voltage (VEE) is, for example, 15V. The read voltage (VRGSL) is, for example, 2.5V. The auxiliary voltage is, for example, 0 to VRGSL.

TABLE 2

|  | program operation | erase operation | single path read operation |
| --- | --- | --- | --- |
| doped region 106 | VPP | 0 | 0 or auxiliary voltage |
| doped region 112 | 0 | 0 | 0 or auxiliary voltage |
| doped region 116 | Ramp | 0 | VRGSL |
| doped region 120 | Ramp | 0 | 0 |
| select gate SG | one-half of VPP | 0 | 0 |
| doped region 104 (erase gate) | Ramp | VEE | 0 or auxiliary voltage |
| P type well 124 | 0 | 0 | 0 |
| N type well 122 | VPP | 0 | VRGSL |

Figure 3:
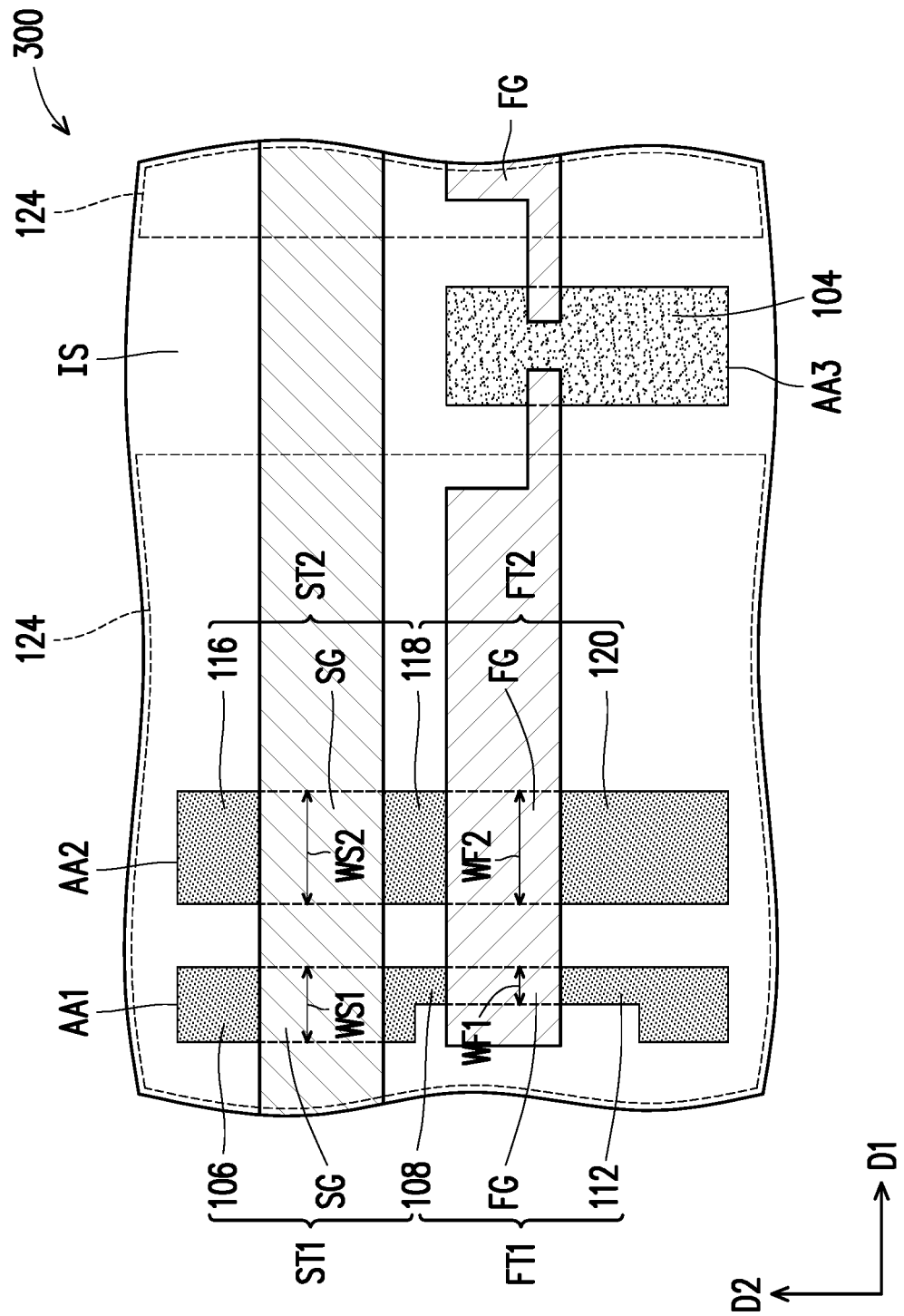
FIG. 3 is a top view of a memory structure according to another embodiment of the invention.

FIG. 3 is a top view of a memory structure according to another embodiment of the invention.

Referring to FIG. 1 and FIG. 3, the difference between the memory structure 300 and the memory structure 100 is as follows. In the memory structure 300, the select transistor ST1, the select transistor ST2, the floating gate transistor FT1, and the floating gate transistor FT2 are exemplified by NMOS transistors, and the doped region 106, the doped region 108, the doped region 112, the doped region 116, and the doped region 118, and the doped region 120 are exemplified by N-type doped regions. Furthermore, the memory structure 300 does not have the N-type well 122 of the memory structure 100. The doped region 106, the doped region 108, the doped region 112, the doped region 116, the doped region 118, and the doped region 120 may be located in the P-type well 124. Furthermore, the same components in the memory structure 300 and the memory structure 100 are denoted by the same reference numerals and the description thereof is omitted.

The difference between the operation method of the memory structure 300 and the operation method of the memory structure 100 is as follows. The programming method of memory structure 300 includes the following steps. When the program operation is performed on the path formed by select transistor ST1 and the floating gate transistor FT1, the program voltage is applied to the doped region 116 and the doped region 120. Moreover, the programming method of memory structure 100 may further include applying a program voltage to the doped region 104. Since the floating gate transistor FT1 is the NMOS transistor, the floating gate transistor FT1 is turn-on state in the erase state. Therefore, when the program operation is performed, it is not necessary to apply the ramp voltage to the doped region 116, the doped region 120, and the doped region 104, and the program voltage may be applied to the doped region 116, the doped region 120, and the doped region 104 to improve the program efficiency. In addition, the principles of the erasing method and the reading method of the memory structure 300 are similar to that of the memory structure 100, and the description thereof is not repeated here.

Furthermore, Table 3 below is taken as an example to describe the voltage application method when the memory structure 300 is operated, but the invention is not limited thereto. In Table 3, the program voltage (VPP) is, for example, 7V. The erase voltage (VEE) is, for example, 15V. The read voltage (VRGSL) is, for example, 1.0V. The auxiliary voltage is, for example, 0 to VRGSL.

TABLE 3

|  | program operation | erase operation | dual path read operation | single path read operation |
|---|---|---|---|---|
| doped region 106 | 0 | 0 | 0 | 0 or auxiliary voltage |
| doped region 112 | VPP | 0 | VRGSL | 0 or auxiliary voltage |
| doped region 116 | VPP | 0 | 0 | 0 |
| doped region 120 | VPP | 0 | VRGSL | VRGSL |
| select gate SG | one-half of VPP | 0 | VRGSL | VRGSL |
| doped region 104 (erase gate) | VPP | VEE | 0 or auxiliary voltage | 0 or auxiliary voltage |
| P type well 124 | 0 | 0 | 0 | 0 |

In the above embodiment, although the select transistor ST1, the select transistor ST2, the floating gate transistor FT1, and the floating gate transistor FT2 are all the PMOS transistors or are all the NMOS transistors as an example, the invention is not limited thereto. In some embodiments, the select transistor ST1, the select transistor ST2, the floating gate transistor FT1, and floating gate transistor FT2 may be any combination of PMOS transistor and NMOS transistor.

In summary, the memory structure of the aforementioned embodiment can effectively improve the electrical performance of the memory device. In addition, the programming method of the memory structure of the aforementioned embodiment can effectively improve the program performance. Moreover, the reading method of the memory structure of the aforementioned embodiment can effectively improve the read performance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
   a first select transistor comprising a select gate, a first doped region, and a second doped region, wherein the first doped region and the second doped region are located on two sides of the select gate;
   a first floating gate transistor comprising a floating gate, the second doped region, and a third doped region, wherein the second doped region and the third doped region are located on two sides of the floating gate;
   a second select transistor comprising the select gate, a fourth doped region, and a fifth doped region, wherein the fourth doped region and the fifth doped region are located on two sides of the select gate;
   a second floating gate transistor comprising the floating gate, the fifth doped region, and a sixth doped region, wherein the fifth doped region and the sixth doped region are located on two sides of the floating gate, and a gate width of the floating gate in the second floating gate transistor is greater than a gate width of the floating gate in the first floating gate transistor; and
   a seventh doped region, wherein the floating gate covers at least a portion of the seventh doped region, the first doped region, the second doped region, and the third doped region are located in a first active region, and
   the fourth doped region, the fifth doped region, and the sixth doped region are located in a second active region, wherein
   in an erase operation, an erase voltage is applied to the seventh doped region, wherein an area of the floating gate that overlaps with the first active region is greater than an area of the portion of the seventh doped region covered by the floating gate, and an area of the floating gate that overlaps with the second active region is greater than the area of the portion of the seventh doped region covered by the floating gate.

2. The memory structure according to claim 1, wherein a gate length of the floating gate in the second floating gate transistor is greater than a gate length of the floating gate in the first floating gate transistor.

3. The memory structure according to claim 1, wherein a gate width of the select gate in the second select transistor is greater than a gate width of the select gate in the first select transistor.

4. The memory structure according to claim 1, wherein a gate width of the select gate in the first select transistor is greater than the gate width of the floating gate in the first floating gate transistor.

5. The memory structure according to claim 1, wherein the select gate and the floating gate are disposed apart from each other and extend in a first direction.

6. The memory structure according to claim 5, wherein the select gate extends through the first select transistor and the second select transistor.

7. The memory structure according to claim 5, wherein the floating gate extends through the first floating gate transistor and the second floating gate transistor.

8. The memory structure according to claim 5, wherein the first select transistor and the first floating gate transistor are arranged in a second direction, and the second direction intersects the first direction.

9. The memory structure according to claim 5, wherein the second select transistor and the second floating gate transistor are arranged in a second direction, and the second direction intersects the first direction.

10. The memory structure according to claim 1, wherein the first select transistor, the second select transistor, the first floating gate transistor, and the second floating gate transistor are PMOS transistors, and the first doped region to the sixth doped region are P-type doped regions.

11. The memory structure according to claim 10, further comprising an N-type well, wherein the first doped region to the sixth doped region are located in the N-type well.

12. The memory structure according to claim 11, further comprising a P-type well, wherein the P-type well is located between the N-type well and the seventh doped region.

13. The memory structure according to claim 10, wherein the seventh doped region is an N-type doped region and is located in a P-type substrate or a P-type well.

14. A programing method of the memory structure according to claim 10, comprising:
   applying a ramp voltage to the fourth doped region and the sixth doped region when a program operation is performed on a path formed by the first select transistor and the first floating gate transistor.

15. The programing method of the memory structure according to claim 14, further comprising applying the ramp voltage to the seventh doped region.

16. The programing method of the memory structure according to claim 15, wherein the ramp voltage is less than or equal to a program voltage.

17. The programing method of the memory structure according to claim 15, wherein a voltage application mode of the ramp voltage comprises a single-stage incremental application mode, a multi-stage incremental application mode, or a smooth incremental application mode.

18. The memory structure according to claim 1, wherein the first select transistor, the second select transistor, the first floating gate transistor, and the second floating gate transistor are NMOS transistors, and the first doped region to the sixth doped region are N-type doped regions.

19. The memory structure according to claim 18, further comprising a P-type well, wherein the first doped region to the sixth doped region are located in the P-type well.

20. The memory structure according to claim 18, wherein the seventh doped region is an N-type doped region and is located in a P-type substrate or a P-type well.

21. A programing method of the memory structure according to claim 18, comprising:
applying a program voltage to the fourth doped region and the sixth doped region when a program operation is performed on a path formed by the first select transistor and the first floating gate transistor.

22. The programing method of the memory structure according to claim 21, further comprising applying the program voltage to the seventh doped region.

23. A reading method of a memory structure, wherein the memory structure comprises:
a first select transistor comprising a select gate, a first doped region, and a second doped region, wherein the first doped region and the second doped region are located on two sides of the select gate;
a first floating gate transistor comprising a floating gate, the second doped region, and a third doped region, wherein the second doped region and the third doped region are located on two sides of the floating gate;
a second select transistor comprising the select gate, a fourth doped region, and a fifth doped region, wherein the fourth doped region and the fifth doped region are located on two sides of the select gate;
a second floating gate transistor comprising the floating gate, the fifth doped region, and a sixth doped region, wherein the fifth doped region and the sixth doped region are located on two sides of the floating gate, and a gate width of the floating gate in the second floating gate transistor is greater than a gate width of the floating gate in the first floating gate transistor; and
a seventh doped region, wherein the floating gate covers at least a portion of the seventh doped region,
the first doped region, the second doped region, and the third doped region are located in a first active region, and
the fourth doped region, the fifth doped region, and the sixth doped region are located in a second active region, wherein
in an erase operation, an erase voltage is applied to the seventh doped region, wherein an area of the floating gate that overlaps with the first active region is greater than an area of the portion of the seventh doped region covered by the floating gate, an area of the floating gate that overlaps with the second active region is greater than the area of the portion of the seventh doped region covered by the floating gate, and
the reading method of the memory structure comprises:
applying an auxiliary voltage to the first doped region and the third doped region when a read operation is performed on a path formed by the second select transistor and the second floating gate transistor.

24. The reading method of the memory structure according to claim 23, further comprising applying the auxiliary voltage to the seventh doped region.

25. The reading method of the memory structure according to claim 24, wherein the auxiliary voltage is less than or equal to a read voltage.

26. A reading method of a memory structure, wherein the memory structure comprises:
a first select transistor comprising a select gate, a first doped region, and a second doped region, wherein the first doped region and the second doped region are located on two sides of the select gate;
a first floating gate transistor comprising a floating gate, the second doped region, and a third doped region, wherein the second doped region and the third doped region are located on two sides of the floating gate;
a second select transistor comprising the select gate, a fourth doped region, and a fifth doped region, wherein the fourth doped region and the fifth doped region are located on two sides of the select gate;
a second floating gate transistor comprising the floating gate, the fifth doped region, and a sixth doped region, wherein the fifth doped region and the sixth doped region are located on two sides of the floating gate, and a gate width of the floating gate in the second floating gate transistor is greater than a gate width of the floating gate in the first floating gate transistor; and
a seventh doped region, wherein the floating gate covers at least a portion of the seventh doped region,
the first doped region, the second doped region, and the third doped region are located in a first active region, and
the fourth doped region, the fifth doped region, and the sixth doped region are located in a second active region, wherein
in an erase operation, an erase voltage is applied to the seventh doped region, wherein an area of the floating gate that overlaps with the first active region is greater than an area of the portion of the seventh doped region covered by the floating gate, an area of the floating gate that overlaps with the second active region is greater than the area of the portion of the seventh doped region covered by the floating gate, and
the reading method of the memory structure comprises:
simultaneously performing a read operation on a path formed by the first select transistor and the first floating gate transistor when the read operation is performed on a path formed by the second select transistor and the second floating gate transistor.

27. The reading method of the memory structure according to claim 26, further comprising applying an auxiliary voltage to the seventh doped region.

28. The reading method of the memory structure according to claim 27, wherein the auxiliary voltage is less than or equal to a read voltage.

* * * * *